(12) United States Patent
Schirmer

(10) Patent No.: US 6,445,592 B1
(45) Date of Patent: *Sep. 3, 2002

(54) ELECTRONIC ASSEMBLY

(75) Inventor: Klaus Schirmer, Ingolstadt (DE)

(73) Assignee: TEMIC Telefunken microelectronic GmbH, Heilbronn (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/697,894

(22) Filed: Sep. 3, 1996

Related U.S. Application Data

(63) Continuation of application No. 08/492,768, filed on Jun. 21, 1995, now abandoned, which is a continuation of application No. 08/252,607, filed on Jun. 1, 1994, now abandoned.

(51) Int. Cl.⁷ ................................................. H05K 1/18

(52) U.S. Cl. ...................... 361/762; 361/709; 361/711; 174/52.2; 174/260; 264/272.11

(58) Field of Search ........................... 361/704, 707, 361/709, 711, 715, 717–719, 720–722, 760–764, 785; 174/52.2, 52.4, 260–261; 264/272.11, 272.12, 272.14; 439/76.1, 76.2

(56) References Cited

U.S. PATENT DOCUMENTS

| | | |
|---|---|---|
| 3,480,836 A | 11/1969 | Aronstein |
| 3,919,602 A | 11/1975 | Kaiser et al. |
| 4,820,196 A | 4/1989 | Roselle et al. |
| 4,916,502 A * | 4/1990 | Oshima ...................... 257/177 |
| 5,053,923 A | 10/1991 | Niemetz |
| 5,311,398 A | 5/1994 | Schirmer et al. |

FOREIGN PATENT DOCUMENTS

| | | | |
|---|---|---|---|
| DE | 7434817 | 1/1975 | |
| DE | 8600928 | 7/1987 | |
| DE | 3631115 | 3/1988 | |
| DE | 3507482 | 8/1988 | |
| DE | 79 09 986 U | 9/1990 | |
| DE | 4004737 | 10/1990 | |
| DE | 4027478 | 3/1992 | |
| DE | 4102265 | 7/1992 | |
| DE | 4112022 | 10/1992 | |
| DE | 4123768 | 1/1993 | |
| EP | 0 368 142 A | 5/1990 | |
| JP | 2194596 | * 8/1990 | ................. 361/704 |
| JP | 2281797 | * 11/1990 | ................. 361/704 |
| JP | 3132098 | * 6/1991 | ................. 361/704 |
| WO | WO A 9212875 | 8/1992 | |

* cited by examiner

Primary Examiner—Albert W. Paladini
(74) Attorney, Agent, or Firm—Venable; Norman N. Kunitz

(57) ABSTRACT

Assemblies for electronic components, in particular for automotive electronics, must satisfy increasingly stringent demands in terms of quality and especially cost efficiency. These demands are met by the assembly in accordance with the present invention, wherein the electronic components are arranged on a printed circuit board which in turn is firmly and directly connected to the surface of the metal plate. The printed circuit board and the components are molded using a suitable plastic material in such a way that the molding creates a positive connection with the metal plate at the periphery of the printed circuit board, and thus forms a moisture-proof housing both for the printed circuit board and for the components. Further advantages are in the considerable savings in material and also in a reduced production depth in comparison with known assemblies, resulting in the required cost efficiency.

12 Claims, 2 Drawing Sheets

ELECTRONIC ASSEMBLY

This application is a continuation of application Ser. No. 08/492,768 filed on Jun. 21, 1995, now abandoned, which is a continuation of application Ser. No. 08/252,607 filed of Jun. 1, 1994, now abandoned.

BACKGROUND OF THE INVENTION

The invention relates to an electronic assembly with a printed circuit board on which electronic components are mounted and a metal plate having a first and second surface and where the printed circuit board is arranged with a positive or direct connection on the first surface of the metal plate.

Assemblies for electronic components, in particular for automotive electronics, must satisfy increasingly high demands in terms of function, quality and reliability. As regards economy, however, these demands are exposed to certain limits. Consequently, in the automotive field in particular, those technologies are used that on the one hand can satisfy the technical requirements and on the other hand permit cost-efficient manufacture.

From DE-OS 41 02 265 an assembly for automotive electronics is known in which a metal plate is used as a carrier for a multilayer printed circuit board or a multilayer foil, and at the same time act as a heat sink for the components located on the printed circuit board or foil as well as being part of the if housing. The assembly becomes a complete housing by providing a hood-shaped cover that positively covers the side of the metal plate that carries the printed circuit board or foil. Furthermore, the space between the cover and the printed circuit board can be filled with an insulating and moisture-resistant material while forming a molding. In this known assembly, a critical point continues to be the hermetically sealed packaging of the components as well as the printed circuit board because leakages can occur between the housing cap, which is generally made of a plastic material, and the metal plate. One measure to improve reliability would be to manufacture a full or partial molding as a soft molding by filling silicon gel in the hollow space between housing cap and printed circuit board. However, because of the high material cost of silicon, this results in high production costs. Furthermore, the high thermal coefficient of expansion of silicon gel leads to mechanical problems.

SUMMARY OF THE INVENTION

The object of the invention is to provide an assembly of the type named at the outset that offers maximum reliability with regard to the sealing of the components and the printed circuit board and low manufacturing costs at the same time.

According to the invention there is provided an electronic assembly with a printed circuit board on which electronic components are mounted and a metal plate having a first and second surface, wherein the printed circuit board is located positively (directly) on the first surface of the metal plate, this metal plate having a surface that overhangs the periphery of the printed circuit board, and where a molding of the is components and the printed circuit board is provided, and where this molding provides a positive or direct connection with the overhanging part of the metal plate at the periphery of the printed circuit board.

For the first time in assembly technology, the present invention makes use of the housing technique known from IC technology, namely that of making the housing as a hard molding by surrounding the IC chips with a mold mass. The molding provides a positive connection at the periphery of the printed circuit board with the metal plate so that together with the metal plate this molding forms a high quality moisture-proof housing that is very reliable even under conditions of cyclic thermal loading.

In accordance with an advantageous embodiment, the molding is made in such a way that the metal plate overhangs at the periphery of the circuit board and molding, thus providing the means of attachment at the overhang.

As a rule, electronic assemblies have the means for connecting leads to them, that is by means of plug connectors, which are joined to the printed circuit board. Such connectors comprise a plug core, which holds the plug pins, and a plug frame which serves as a guide socket and which is provided with a seal and latch. In an embodiment of this type, the plug frame as a molding around the plug core is at the same time made as a molding around the components and the printed circuit board. The plug costs can thus be minimized because the production costs of the plug manufacturer are reduced and in total this leads to lower production costs for the assembly. In an embodiment of this type, the printed circuit board is located on the first surface of the metal plate, while a plug of this type is located on the second surface of this metal plate and is enclosed on both sides by the molding mass.

In another preferred development of the invention, the plug is designed in the form of an edge connector. For fitting an edge connector of this type, the metal plate has a recess in its edge region, with this recess being so deep that an edge region of the printed circuit board sufficient for fitting the edge connector extends into this recess, while this edge region of the printed circuit board is not enclosed by the molding mass. Since the plug itself is on the cable side in such an embodiment, the assembly has no separate plug Which means that the housing tool costs for plug, cover etc. are reduced to just a single tool.

In such an embodiment, on the second surface of the metal plate in the edge region of the printed circuit board accommodating the edge connector, a surrounding molding of the contact area of the metal plate with the printed circuit board is preferably provided in order to prevent the penetration of moisture.

Moreover, the edge connector in the above embodiment can advantageously be designed as a zero-force plug connector.

A further reduction in production costs is obtained by using components without housings, i.e. IC chips, instead of components with housing, and which are bonded to the printed circuit board after soldering. The main reason for the cost saving is that the semi-conductor manufacturer no longer needs to manufacture the housing.

Finally, in a last advantageous development of the invention, a multilayer printed circuit board or a multilayer foil can be used as the printed circuit board, which results in better utilization of the existing printed circuit board surface and a consequently smaller volume of the assembly.

BRIEF DESCRIPTION OF THE DRAWINGS

The invention will now be described and explained on the basis of embodiment examples together with the drawings. These show.

DESCRIPTION OF THE PREFERRED EMBODIMENTS

Figure 2:
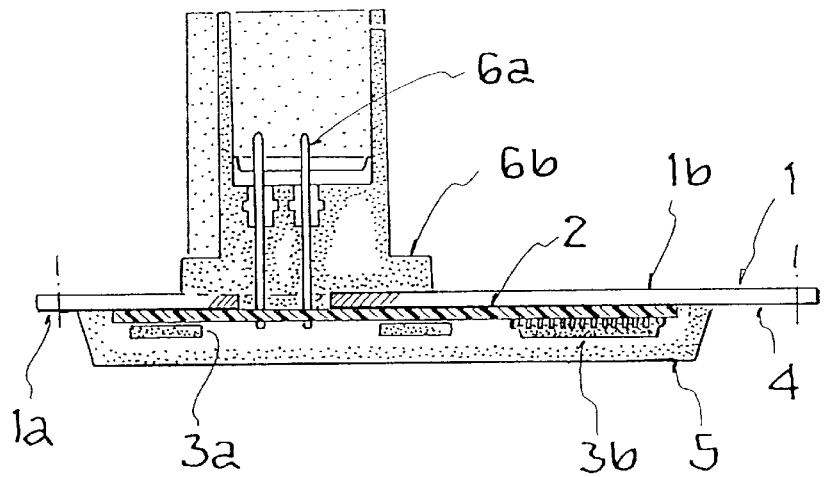
FIG. 2 a sectional view A—A of the assembly in accordance with FIG. 1.
Figure 1:
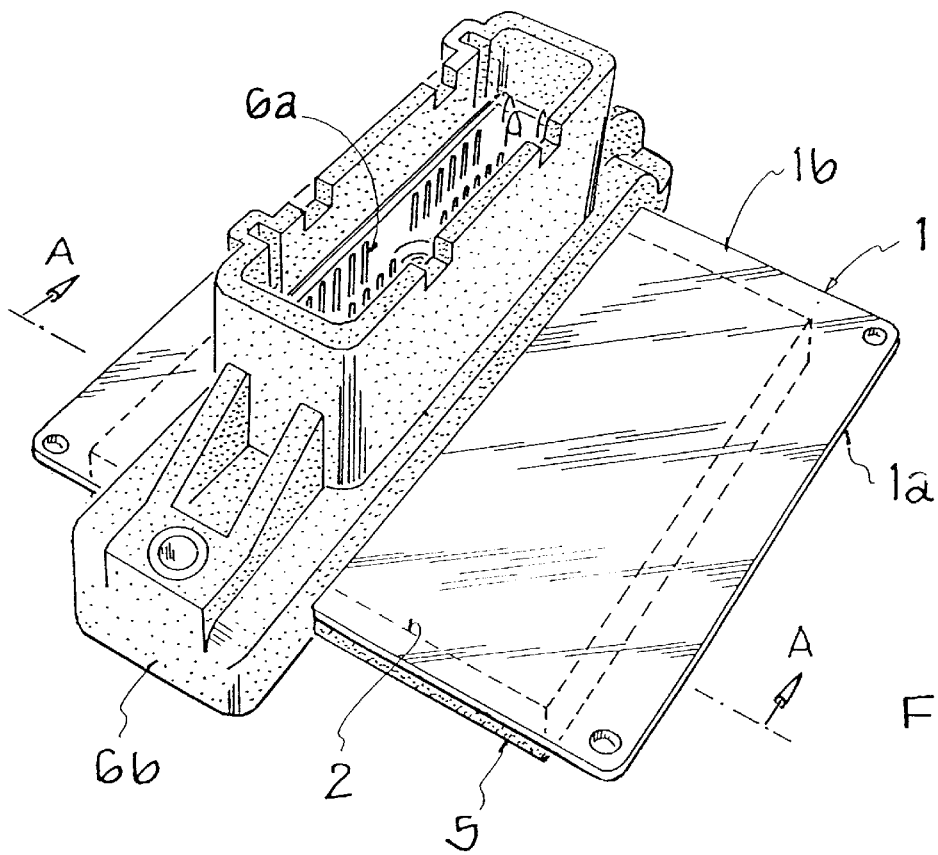
FIG. 1 a perspective view of an assembly in accordance with the present invention.

The assembly in accordance with FIGS. 1 and 2 comprises a metal plate 1 of aluminum whose surface 1a directly supports a printed circuit board 2. This printed circuit board can be in the form of a multilayer printed circuit board or as a multilayer foil, where such multilayer printed circuit boards are positively bonded over the whole surface with the aluminum carrier plate 1. In the production of such multilayer foils the individual foils are placed loosely one above another on the metal plate 1, where between each of these foils or between each of the foils adjacent to the metal plate 1 an adhesive foil or a thin adhesive layer is also placed or put on it. Such a foil is a pre-interlaced, that is not fully hardened, adhesive foil with glassfiber material (pre-preg). These foils are pressed together by the application of pressure and heat so that the materials completely contact each other. The printed circuit board 2 is somewhat smaller than metal plate 1 in terms of the surface area in contact so that an edge 4 is formed around the periphery of the printed circuit board by the metal plate 1.

The printed circuit board 2 has power transistors 3a and other electronic components 3 mounted on it that are designed as SMD (Surface Mounted Device) components. The aluminum plate 1 thus acts as a printed circuit board carrier, cooling body and housing base, while the heat distributing aluminum plate 1 provides for optimum heat distribution.

The named assembly in accordance with FIGS. 1 and 2 also has a plug connector made Up of a plug core 6a and a plug guide of frame 6b. This plug connector is arranged on the other surface 1b of the metal plate 1 in a central position so that the shortest possible conductor paths result to the power transistors 3a.

To complete the assembly, the printed circuit board 2 with the electronic components 3 and 3a and at the same time the plug core 6a is surrounded by a molded mass 5 in such a way that, together with the metal plate 1, a closed housing results. This housing comprises not only the metal plate 1, but also the molding 5 of the printed circuit board and the components as well as a molding 6b which represents the plug frame with seal and latch. This molding is known from IC technology and can be made, for example, from a mold mass called Aratronic 2180-4 from the company Ciba Geigy, and of which the small thermal coefficient of expansion makes it possible to mold large volumes of this kind.

The moldings 5 and 6b are produced in a single operation and on the one hand provide a moisture-proof connection between surface 1a of metal plate 1 on the peripheral edge of printed circuit board 2 and the metal plate 1, and on the other hand a positive connection with the plug core 6a and the surface 1b of the metal plate. Since the thee frame 6b is made of a thermo-plastic material and the mold mass is a duroplast, no problems result with respect to the positive connection of the plug pins and these two plastic materials.

The molding 5 of printed circuit board 2 is designed in such a way that part of the peripheral edge 4 presented by metal plate 1 remains uncovered by the mold mass.

By molding the complete assembly there are several advantages: considerable savings are made with the plugs because, firstly, the plug manufacturer need not make a plug frame and, secondly, it is also simpler to fit the plug. Moreover, there are considerable savings with regard to the housing tools because only a single tool is required for the molding operation. Furthermore, the size of such an assembly is even smaller than others that are state-of-the-art and they are also more robust.

In the assembly described above, commercially available components, that is components with housings, are still used. A further cost advantage is obtained in that only IC chips (die) are used, that is components without housings. Electronic contacting with the printed circuit board then takes place by means of a bonding process. The cost savings are then provided by the components without housing. A further advantage results from the improved recycling capability because only plastic material of one kind is used.

Figure 3:
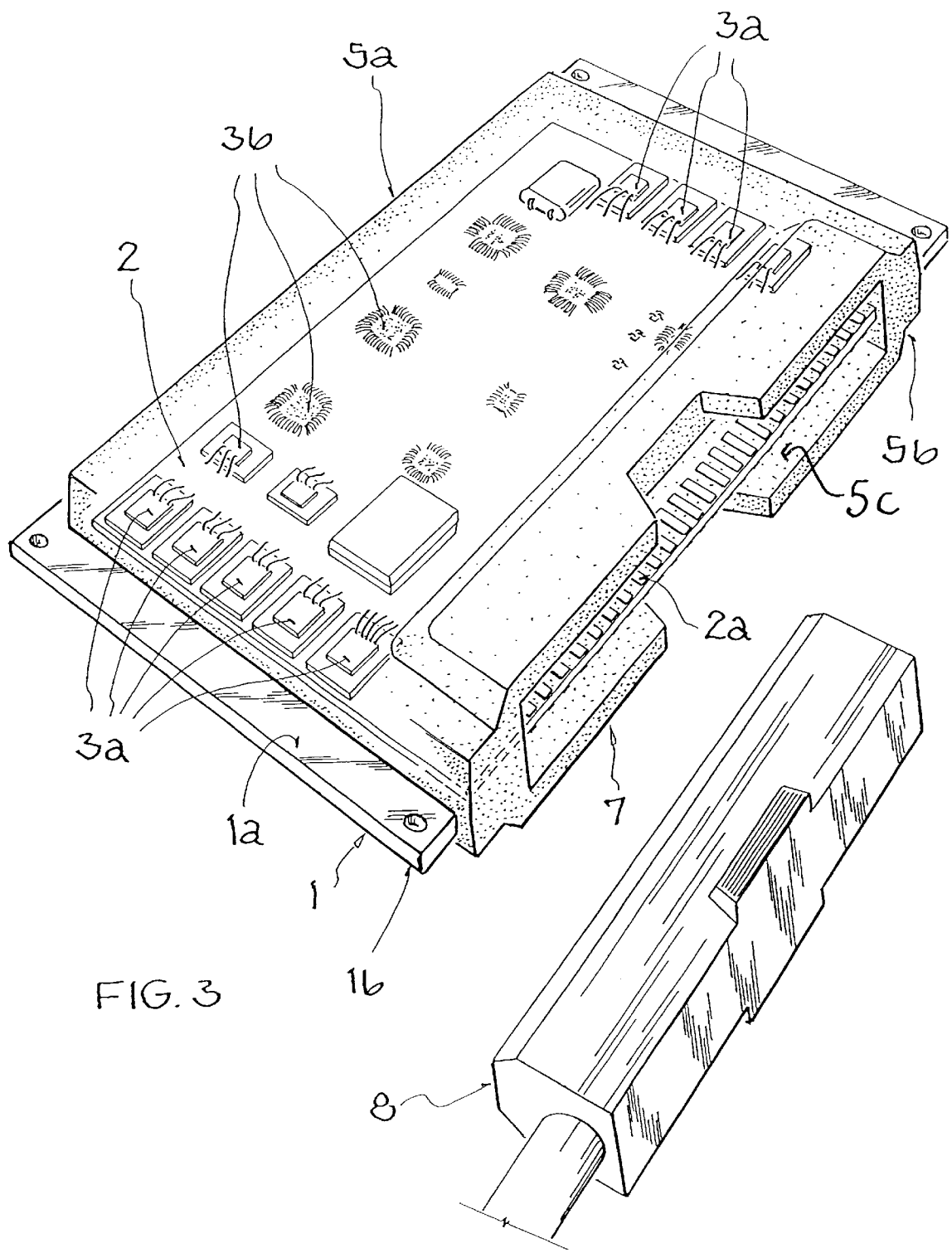
FIG. 3 a perspective view of another assembly in accordance with the present invention with an edge connector.

In the assembly according to FIG. 3, a further saving is obtained with respect to the plug because this is replaced by an edge connector 8. The metal plate 1 has a recess 7 for this purpose and this recess is so designed that an edge region of the printed circuit board 2 protrudes into this recess 7. In this edge region of the printed circuit board 2, printed circuit conductors terminate with end contacts 2a that provide the electrical contact to edge connector 8. The molding 5a of the printed circuit board also has a cutout in this region because the end contacts 2a must remain uncovered. Since the rear of the printed circuit board 2 no longer rests completely on metal plate 1, it is necessary to provide a moisture-proof sealing at the appropriate connecting point between the rear of the printed circuit board 2 and the metal plate 1. This is accomplished by surrounding, with a molding mass, the rear of the printed circuit board 2 and the surface 1b of the metal plate 1 at the same time as molding the printed circuit board 2 and its components (cf. reference item 5b) and at the same time forming a guide shaft 5c for plug 8.

In other respects, the assembly according to FIG. 3 is made up in the same way as the assembly according to FIGS. 1 and 2.

The assemblies described in the Figures include a metal plate with a size of approx. 120 cm$^2$. The present invention is not limited to such a size, but can be used in assemblies that cover an even larger area.

The assemblies described here can be used advantageously in automotive technology. They could also be used wherever logic and power are to be combined together within a minimum of space or where "Smart Power" modules are to be integrated as sub-systems in larger systems or units. Apart from automotive technology, the fields of telecommunications and industrial electronics are possible areas of application, in particular also in rack-mounting systems with heat removal via the aluminum plate on the housing frame. In this case, an electrical plug-in connection is possible on both sides via a backplane wiring of the assemblies amongst each other.

What is claimed is:

1. Electronic assembly comprising a printed circuit board on which electronic components are mounted, and a plane metal plate having first and second opposed surfaces with the printed circuit board being surface mounted directly on the first surface of the metal plate and wherein:

a) the metal plate has a surface portion that extends laterally beyond the periphery of the printed circuit board; and b) a housing for the components and for the printed circuit board is provided, with said housing consisting of the metal plate and a molded mass disposed on said one surface of said metal plate and surrounding the components and the printed circuit board, with this molded mass providing a positive direct connection with the surface portion of the metal plate extending around the periphery of the printed circuit board and forming an outer surface of the housing.

2. Electronic assembly in accordance with claim 1, wherein the surface portion the metal plate further extends laterally beyond the periphery of the molded mass.

3. Electronic assembly in accordance with claim 2, wherein end contacts for connecting leads on the printed circuit board extend to an edge region of the printed circuit board; and wherein an edge connector is connected to said end contacts of the leads on said printed circuit board.

4. Electronic assembly in accordance with claim 2, wherein a multilayer board is used as the printed circuit board.

5. Electronic assembly comprising a printed circuit board on which electronic components are mounted, and a plane metal plate having first and second opposed surfaces with the printed circuit board being surface mounted directly on the first surface of the metal plate; and wherein:

a) the metal plate has a surface portion that overhangs the periphery of the printed circuit board;

b) a molding of the components and of the printed circuit board is provided, with this molding providing a positive direct connection with the overhanging surface portion of the metal plate around the periphery of the printed circuit board and, together with the metal plate, forming a housing for the components and the printed circuit board;

c) the surface portion of the metal plate further overhangs the periphery of the molding; and, d) a plug connected with the printed circuit board is provided, with said plug comprising a plug core and a plug frame, and wherein the plug frame is a molding of the plug core and forms a single molding with the molding of the components and the printed circuit board.

6. Electronic assembly in accordance with claim 5, wherein the plug is located on the second surface of the metal plate.

7. Electronic assembly comprising a printed circuit board on which electronic components are mounted, and a plane metal plate having first and second opposed surfaces with the printed circuit board being surface mounted directly on the first surface of the metal plate; and wherein:

a) the metal plate has a surface portion that overhangs the periphery of the printed circuit board;

b) a molding of the components and of the printed circuit board is provided, with this molding providing a positive direct connection with the overhanging surface portion of the metal plate around the periphery of the printed circuit board and, together with the metal plate, forming a housing for the components and the printed circuit board;

c) the surface portion of the metal plate further overhangs the periphery of the molding;

d) end contacts for connecting leads on the printed circuit board extend to an edge region of the printed circuit board for use by an edge connector to provide connections to the leads of the printed circuit board; and, the metal plate has a recess in the region of the edge in order to fit the edge connector, said recess being so deep that the edge region of the printed circuit board, sufficient for fitting the edge connector, projects into this recess and that this edge region of the printed circuit board is not contained in the molding.

8. Electronic assembly in accordance with claim 7, wherein a molding is provided on the second surface of the metal plate adjacent the edge region of the printed circuit board and over the region of contact of the metal plate with the printed circuit board, with this molding and those of the components and the printed circuit board forming a single molding.

9. Electronic assembly in accordance with claim 8, wherein a guide frame for the edge connector is formed by the molding.

10. Electronic assembly in accordance with claim 9, wherein a zero-force connector is used as the edge connector.

11. Electronic assembly in accordance with claim 10, wherein semi-conductor chips without housings are used as the electronic components.

12. Electronic assembly in accordance with claim 11, wherein a multilayer board is used as the printed circuit board.

* * * * *